(12) United States Patent
Cheng et al.

(10) Patent No.: US 7,388,261 B2
(45) Date of Patent: Jun. 17, 2008

(54) STRUCTURE AND METHOD FOR ACCURATE DEEP TRENCH RESISTANCE MEASUREMENT

(75) Inventors: Kangguo Cheng, Beacon, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/853,040

(22) Filed: Sep. 11, 2007

(65) Prior Publication Data
US 2007/0296011 A1 Dec. 27, 2007

Related U.S. Application Data

(62) Division of application No. 10/904,528, filed on Nov. 15, 2004, now Pat. No. 7,319,259.

(51) Int. Cl.
*H01L 29/76* (2006.01)
(52) U.S. Cl. ........................ 257/374; 257/301
(58) Field of Classification Search ................ 257/374, 257/301
See application file for complete search history.

(56) References Cited

U.S. PATENT DOCUMENTS

| 5,448,090 | A | 9/1995 | Geissler et al. |
| 6,495,883 | B2 | 12/2002 | Shibata et al. |
| 6,627,513 | B1 | 9/2003 | Tsai et al. |
| 6,759,702 | B2 | 7/2004 | Radens et al. |
| 7,319,259 | B2 * | 1/2008 | Cheng et al. ............... 257/374 |
| 2004/0198014 | A1 | 10/2004 | Wu et al. |
| 2005/0101094 | A1 | 5/2005 | Kito et al. |
| 2005/0127422 | A1 | 6/2005 | Hsiao et al. |
| 2005/0176198 | A1 | 8/2005 | Kudelka |

* cited by examiner

*Primary Examiner*—Long Pham
(74) *Attorney, Agent, or Firm*—Cantor Colburn LLP; Lisa U. Jaklitsch

(57) ABSTRACT

A test structure for implementing resistance measurement of a deep trench formed in a semiconductor device includes a pair of deep trenches formed within a semiconductor substrate. The pair of deep trenches has a dielectric material formed on side and bottom surfaces thereof, and includes a conductive fill material therein. Bottom portions of the pair of deep trenches are merged with one another so as to provide an electrically conductive path therethrough.

6 Claims, 3 Drawing Sheets

STRUCTURE AND METHOD FOR ACCURATE DEEP TRENCH RESISTANCE MEASUREMENT

CROSS REFERENCE TO RELATED APPLICATION

This application is a divisional application of U.S. Ser. No. 10/904,528, filed Nov. 15, 2004, the disclosures of which are incorporated by reference herein in their entirety.

BACKGROUND

The present invention relates generally to semiconductor device manufacturing, and, more particularly, to a structure and method for accurate deep trench resistance measurement.

Dynamic random access memory (DRAM) is a type of semiconductor memory in which the information is stored as data bits in capacitors on a semiconductor integrated circuit. Each bit is typically stored as an amount of electrical charge in a storage cell consisting of a capacitor and a transistor. A practical DRAM circuit generally includes an array of memory cells interconnected by rows and columns, which are referred to as wordlines and bitlines, respectively. Reading data from or writing data to memory cells is achieved by activating selected wordlines and bitlines. More specifically, a trench DRAM memory cell may include a metal-oxide-semiconductor field-effect transistor (MOSFET) connected to a deep trench (DT) capacitor. The transistor includes gate and diffusion regions that are referred to as either drain or source regions, depending on the operation of the transistor.

Typically, the deep trench capacitor is formed in a silicon substrate using one or more conventional techniques, such as reactive ion etching (RIE), with photoresist or other materials as a mask to cover the areas where trench formation is not desired. The trench is typically filled with a conductor material (most commonly n-type doped polysilicon), which serves as one plate of the capacitor, usually referred to as the "storage node." The second plate of the capacitor is typically formed by outdiffusion of an n-type doped region surrounding the lower portion of the trench, usually referred to as the "buried plate." A node dielectric layer, which may include, for example, silicon dioxide ($SiO_2$), silicon nitride (SiN), silicon oxynitride (SiON), tantalum oxide ($Ta_2O_5$), aluminum oxide ($Al_2O_3$), or any other dielectric material, is provided to separate the storage node and buried plate, thereby forming the capacitor.

One significant parameter of interest in the manufacture of DRAM deep trench capacitors is the distributed resistance of the polysilicon fill material (i.e., the storage node material), since the time constant (and thus operating speed of a semiconductor device) is limited by the resistance. The traditional practice has been to estimate this polysilicon resistance value, using the known resistivity of blanket-deposited polysilicon in combination with the DT geometry. However, the accuracy of such an estimation-based approach is less than could otherwise be obtained by means of some type of direct measurement.

U.S. Pat. No. 6,627,513 to Wu, et al. describes one possible method for measuring trench resistance. However, there are at least two potential drawbacks associated with the approach described therein. First, the structure actually used for the resistance measurement is quite different from the actual functional deep trenches that would be formed in a DRAM array environment, in that the test structure calls for the formation of a collar along the entire length of the trench, followed by the removal of the collar in trench bottom. Moreover, based upon the described ion implantation energy used to dope the substrate and n-well in the Wu patent, it becomes readily apparent to one skilled in the art that the approach therein results in a much shorter version of a deep trench with respect to a functional deep trench. Thus, a direct measurement of such a test trench structure would not accurately reflect the resistance of fully defined deep trench.

Furthermore, the applicability of the Wu approach to a fully defined deep trench (by simply increasing the implant energy) is not practical, since standard implantation equipment is not capable of implanting an n-type dopant to a depth of about 7-8 microns. Accordingly, it would be desirable to be able to implement a structure and method for accurately measuring deep trench resistance, for a full-depth trench, in either an integrated or a short-loop process so as to result in minimal disruption of an existing process of record.

SUMMARY

The foregoing discussed drawbacks and deficiencies of the prior art are overcome or alleviated by a test structure for implementing resistance measurement of a deep trench formed in a semiconductor device. In an exemplary embodiment, the test structure includes a pair of deep trenches formed within a semiconductor substrate. The pair of deep trenches has a dielectric material formed on upper portions of sidewall surfaces thereof, and includes a conductive fill material therein. A doped buried plate region encompasses bottom portions of the pair of deep trenches, wherein the doped buried plate region provides an electrically conductive path between the pair of deep trenches.

In still another embodiment, a test structure for implementing resistance measurement of a deep trench formed in a semiconductor device includes a deep trench structure formed within a semiconductor substrate, the deep trench being formed at a depth of at least about 7 microns. A first electrical contact is formed on a surface of the semiconductor substrate, and a second electrical contact is formed on a surface of the semiconductor substrate. An electrically conductive path is defined between the first electrical contact, the deep trench structure, and the second electrical contact.

BRIEF DESCRIPTION OF THE DRAWINGS

Referring to the exemplary drawings wherein like elements are numbered alike in the several Figures.

DETAILED DESCRIPTION

Disclosed herein is a structure and method for accurately measuring deep trench resistance of a fully defined deep trench. Briefly stated, a first and a second embodiment utilizes a pair of adjacent deep trenches in which a conductive path is provided therethrough for measurement of the trench resistance, while a third embodiment utilizes a single deep trench, a horizontally disposed n-well, and a vertically disposed n-well to define a conductive path. Some of the advantageous features of one or more of the exemplary embodiments described hereinafter include, but are not limited to: a direct resistance measurement of trenches that are only slightly different from array trenches used in an actual DRAM array environment (i.e., a full-depth DT resistance measurement); suitability of the resistance measurement for either short-loop or full process characterization; compatibility with existing DRAM manufacturing processes; and an accurate DT resistance by avoiding more complex calculations that may otherwise introduce unknown factors.

Figure 1:
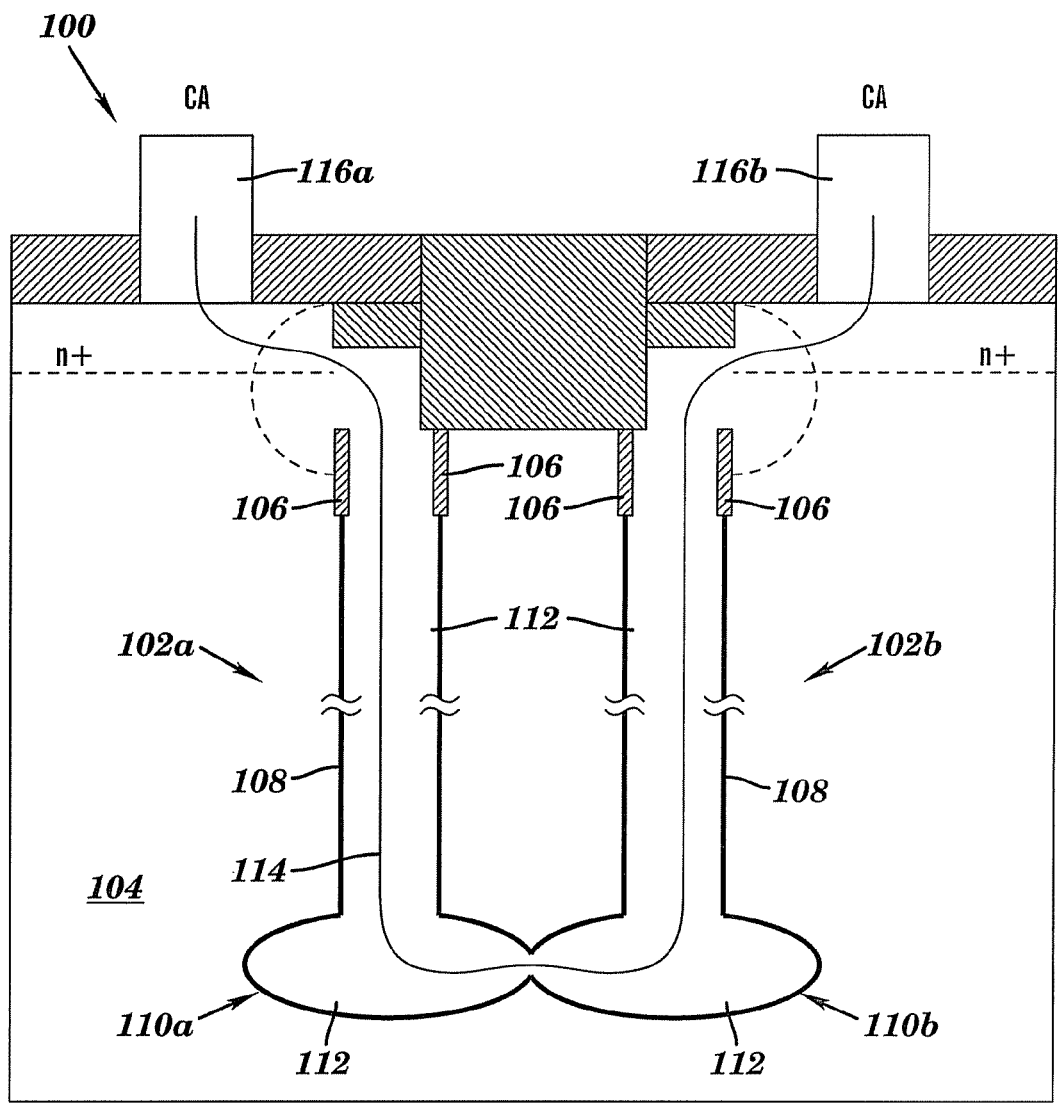
FIG. 1 is a structure for measuring deep trench resistance in accordance with a first embodiment of the invention.

Referring initially to FIG. 1, there is shown a cross sectional view of a test structure 100 for facilitating measurement deep trench resistance, in accordance with a first embodiment of the invention. As is shown, the test structure 100 includes a pair of neighboring deep trenches 102a, 102b formed within a semiconductor substrate 104. Each trench 102a, 102b, is configured with an insulative collar 106 (e.g. oxide) at an upper portion thereof. Below the collar regions, the sidewalls of the deep trenches 102a, 102b are provided with a node dielectric material 108 formed thereon, as will be recognized by one skilled in the art. However, it will further be noted that the bottom portions 110a, 110b of the deep trenches 102a, 102b are expanded so as to be physically merged with one another, and thus become electrically contiguous when filled with a storage node material 112.

In order to facilitate the merger of the bottom portions 110a, 110b of the deep trenches 102a, 102b, a trench "bottle" process, as is known in the art, may be used. A suitable example of carrying out a trench bottle shaping process is discussed in U.S. Published Application 2004/0198014, by Wu, et al., the contents of which are incorporated herein in their entirety.

In a conventional process, trench "bottling" is a technique that is used to increase the deep trench surface area and thus increase the deep trench capacitance. For a functional portion of a DRAM array, the merger of a pair of adjacent deep trenches would result in a process defect. Thus, it is desirable to be able to merge the bottom portions 110a, 110b of the test structure deep trenches 102a, 102b, while also ensuring that neighboring trenches in the functional portion of the device are not merged with one another. Moreover, for the test structure 100, it is further desirable to merge the trenches 102a, 102b only at the bottom portions 110a, 110b thereof, so as to approximate (as close as possible) the actual resistance of a deep trench of a comparable geometry and depth.

In this regard, one possible approach for facilitating the merger of the bottom portion of the test structure deep trenches, without causing a merger of array deep trenches may be to simply pattern the test portion of the memory device such that spacing between the adjacent test deep trenches 102a, 102b is less than that of the spacing between any pair of deep trenches in the functional array. Another approach that could alternatively be used, or used in conjunction with the first approach is to arrange the patterning of the test deep trenches 102a, 102b such that the initial sidewall interface therebetween is located along the (100) surface of the single crystalline silicon, as opposed to a conventional (110) sidewall interface. Because a single crystalline silicon (110) surface etches slower than the (100) surface, a configuration in which the test deep trench exposed surfaces are the (100) surfaces results in a wet etch for the bottom bottle process at a quicker rate then for a (110) surface. As a result, the bottom portions of the deep trenches 102a, 102b would merge long before the deep trenches in the array area during a trench bottling process.

Regardless of the particular manner of formation, it will be appreciated that the test structure 100 provides a conductive path 114 between a pair of adjacent substrate surface contacts (CA) 116a, 116b. Accordingly, by providing a current path between contacts 116a, 116b, the resistance of series connected deep trenches 102a, 102b may be obtained. Instead of a more complex calculation involving polysilicon resistivity and estimated trench geometry, the resulting measurement may simply be divided by a factor of two to obtain the measured resistance for a single deep trench. Again, because only the bottom portions 110a, 110b of the trenches 102a, 102b are enlarged, the resistance of the resulting structure is in close proximity to actual array deep trenches. Moreover, the present embodiment does not rely solely on using an implanted region (at relatively shallow depths) to complete the conductive path between the test trenches.

Figure 2:
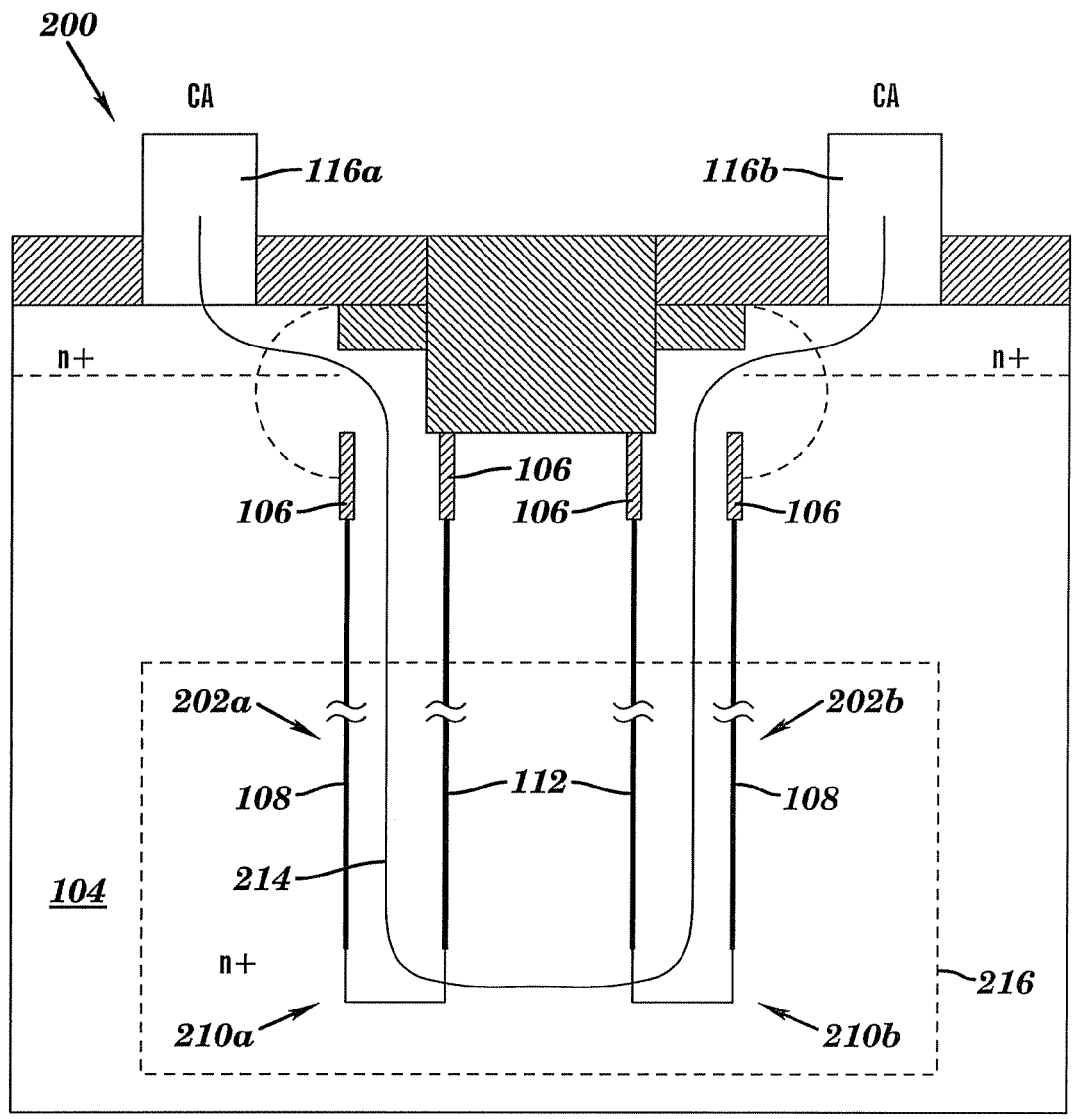
FIG. 2 is a structure for measuring deep trench resistance in accordance with a second embodiment of the invention.

Referring now to FIG. 2, there is shown a cross sectional view of a test structure 200 for facilitating measurement deep trench resistance, in accordance with a second embodiment of the invention. Similar to the test structure 100 of FIG. 1, test structure 200 utilizes a pair of neighboring deep trenches 202a, 202b to form a conducting path. For ease of description, identical reference numerals are used to depict like elements in the various embodiments. In lieu of merging the bottom portions 210a, 210b of the deep trenches 202a, 202b, the test structure 200 is instead configured such that the node dielectric material 108 is not present on the bottom portions 210a, 210b. The conductive path 214 between the trenches 202a, 202b is instead completed through the heavily doped buried plate region 216 normally used in forming the second electrode of a functional DRAM capacitor.

With respect to the embodiment of FIG. 1, the formation of the neighboring deep trenches 202a, 202b is perhaps simpler in that a trench bottling process need not be used, and the spacing therebetween may correspond to spacing between neighboring trenches in a functional portion of a DRAM array.

Figure 3:
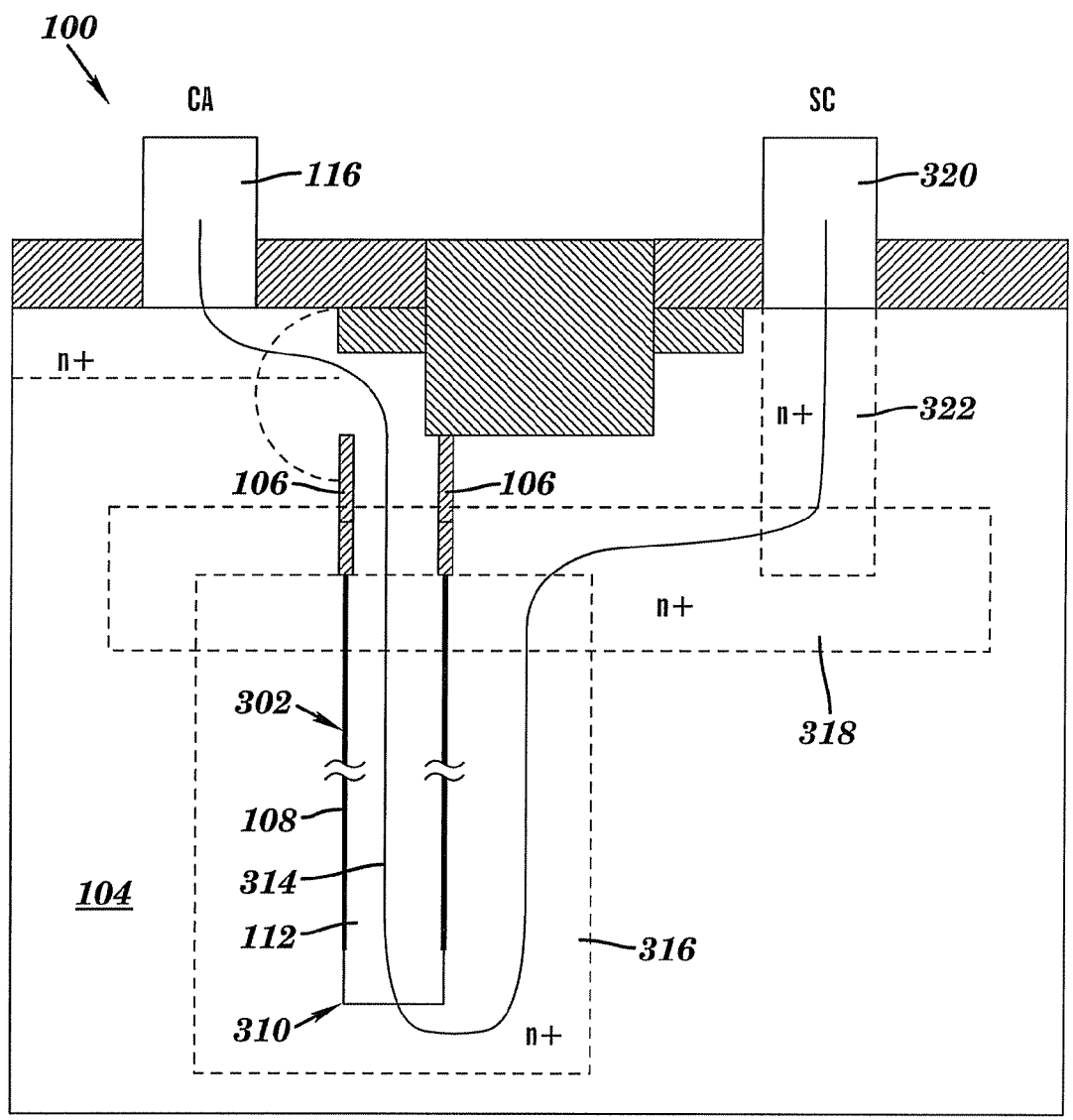
FIG. 3 is a structure for measuring deep trench resistance in accordance with a third embodiment of the invention.

Finally, FIG. 3 is a cross sectional view of a test structure 300 for facilitating measurement deep trench resistance, in accordance with a third embodiment of the invention. In contrast to the embodiments of FIGS. 1 and 2, the test structure 300 utilizes a single deep trench 302. Similar to the embodiment of FIG. 2, the deep trench 302 is formed in a manner such that the node dielectric material 108 is not present on the bottom portion 310 thereof. In order to complete a conductive path 314 that includes the deep trench 302, a buried plate region 316 is formed so as to be in contact with a horizontal n-well band 318.

The horizontal n-well band 318 may be formed by dopant implantation, and can be incorporated into existing processes of record, where such bands are used (for example) as a bus structure for biasing a plurality of buried plate regions to a common voltage. In an exemplary embodiment, the horizontal n-well band 318 may be formed at a depth of about 1.5 microns. Then, to complete the conductive connection between the first surface contact 116, through the deep trench 302, and to a second surface contact (SC) 320, a vertical n-well band 322 is formed in contact with the horizontal n-well band 318 and the second surface contact 320. As with the horizontal n-well band 318, the vertical n-well band 322 may be formed by an implantation step.

Regardless of the test structure embodiment(s) implemented, it will be appreciated that a resistance measurement thereof is carried out for a fully defined deep trench (e.g., a trench on the order of about 7-8 microns in depth) and, as such, the measurement has an increased degree of accuracy associated therewith. In the case where a pair of deep trenches is used for the measurement, a resistance calculation for a single trench is fairly straightforward.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor device, comprising:
   a test structure including a pair of deep trenches formed within a semiconductor substrate;
   said pair of deep trenches having a dielectric material formed on upper portions of sidewall surfaces thereof, and said pair of deep trenches including a conductive fill material therein; and
   a doped buried plate region encompassing bottom portions of said pair of deep trenches, wherein said doped buried plate region provides an electrically conductive path between said pair of deep trenches, thereby facilitating a resistance measurement of said deep trench structure of said test structure.

2. The semiconductor device of claim 1, wherein one of said pair of deep trenches is in electrical contact with a first substrate surface contact, and the other of said pair of deep trenches is in electrical contact with a second substrate surface contact.

3. The semiconductor device of claim 1, wherein said conductive fill material comprises polysilicon.

4. The semiconductor device of claim 1, wherein said pair of deep trenches are formed at a depth of at least about 7 microns.

5. A semiconductor device, comprising:
   a test structure including a deep trench structure formed within a semiconductor substrate, said deep trench being formed at a depth of at least about 7 microns;
   a first electrical contact formed on a surface of said semiconductor substrate; and
   a second electrical contact formed on a surface of said semiconductor substrate;
   wherein an electrically conductive path is defined between said first electrical contact, said deep trench structure, and said second electrical contact, thereby facilitating a resistance measurement of said deep trench structure of said test structure.

6. The semiconductor device of claim 5, wherein said deep trench structure further comprises:
   a pair of deep trenches formed within said semiconductor substrate;
   said pair of deep trenches having a dielectric material formed on upper portions of sidewall surfaces thereof, and said pair of deep trenches including a polysilicon fill material therein; and
   a doped buried plate region encompassing bottom portions of said pair of deep trenches, wherein said doped buried plate region provides an electrically conductive path between said pair of deep trenches.

* * * * *